(12) United States Patent
Taylor

(10) Patent No.: US 10,515,529 B1
(45) Date of Patent: Dec. 24, 2019

(54) ENERGIZED CIRCUIT ALARM ASSEMBLY

(71) Applicant: Timothy Taylor, Cartersville, GA (US)

(72) Inventor: Timothy Taylor, Cartersville, GA (US)

( * ) Notice: Subject to any disclaimer, the term of this patent is extended or adjusted under 35 U.S.C. 154(b) by 0 days.

(21) Appl. No.: 16/253,836

(22) Filed: Jan. 22, 2019

(51) Int. Cl.
*G08B 21/02* (2006.01)
*H02B 1/46* (2006.01)
*F21V 33/00* (2006.01)

(52) U.S. Cl.
CPC .............. *G08B 21/02* (2013.01); *H02B 1/46* (2013.01); *F21V 33/0076* (2013.01)

(58) Field of Classification Search
CPC ........ G08B 21/02; H02B 1/46; F21V 33/0076
USPC .......................... 340/654, 657, 661, 660, 662
See application file for complete search history.

(56) References Cited

U.S. PATENT DOCUMENTS

| | | | | |
|---|---|---|---|---|
| 3,784,842 A | | 1/1974 | Kremer | |
| 4,609,914 A | * | 9/1986 | Fathi | G01R 19/16547 324/131 |
| 4,706,073 A | | 10/1987 | Vila Masot | |
| 4,983,954 A | * | 1/1991 | Huston | G08B 21/182 324/457 |
| 5,283,553 A | * | 2/1994 | Ishii | H02H 3/04 335/17 |
| 6,150,945 A | * | 11/2000 | Wilson | G01R 29/12 324/457 |
| 6,198,403 B1 | * | 3/2001 | Dorrough | G01R 19/2513 324/103 R |
| 6,853,307 B2 | * | 2/2005 | Nickerson | B66C 15/065 340/551 |
| 6,897,783 B2 | | 5/2005 | Zeng | |
| 7,295,130 B2 | * | 11/2007 | Luebke | G01R 1/06788 324/76.11 |
| 7,468,674 B2 | * | 12/2008 | Onachilla | H02G 1/005 340/660 |
| 7,528,734 B2 | * | 5/2009 | Kuo | H02H 11/006 307/112 |
| 7,647,439 B2 | * | 1/2010 | Lubben | G08B 25/06 324/500 |
| 8,384,548 B2 | | 2/2013 | Knopf | |
| 8,421,639 B2 | * | 4/2013 | Bitsch | G01R 19/16547 340/660 |
| 9,698,590 B1 | | 7/2017 | Mercado | |
| 10,247,763 B1 | * | 4/2019 | Wu | A41D 19/001 |
| 2008/0129523 A1 | * | 6/2008 | Assimos | H02H 9/042 340/662 |
| 2009/0201145 A1 | | 8/2009 | Vasquez | |
| 2009/0243870 A1 | * | 10/2009 | Dai | H02H 3/20 340/662 |

(Continued)

*Primary Examiner* — Ojiako K Nwugo

(57) ABSTRACT

An energized circuit alarm assembly includes a housing that is positoinable on a metal circuit housing in an electrical distribution system. A magnet is coupled to the housing and the magnet magnetically engages a metal circuit housing in an electrical distribution system. A plurality of conductors is each coupled to and extends away from the housing. Each of the conductors is electrically coupled to a respective electrical lead in the metal circuit housing when an electrician is servicing a circuit fed by the electrical lead. An alarm unit is coupled to the housing and each of the conductors is electrically coupled to the alarm unit. The alarm unit emits an alert when the alarm unit senses electrical current on any of the conductors to alert the electrician to the potential for electrocution.

9 Claims, 5 Drawing Sheets

(56) References Cited

U.S. PATENT DOCUMENTS

| | | | | |
|---|---|---|---|---|
| 2010/0033908 | A1* | 2/2010 | Fernald, Jr. | H02M 5/14 |
| | | | | 361/641 |
| 2010/0052929 | A1* | 3/2010 | Jackett | G01R 29/085 |
| | | | | 340/660 |
| 2010/0231399 | A1* | 9/2010 | Allen | G01R 19/155 |
| | | | | 340/662 |
| 2012/0019391 | A1* | 1/2012 | Goings | G01R 19/145 |
| | | | | 340/657 |
| 2013/0214922 | A1* | 8/2013 | Clarke | G01R 19/155 |
| | | | | 340/514 |
| 2014/0132417 | A1* | 5/2014 | Clark | H01H 9/281 |
| | | | | 340/654 |
| 2017/0099888 | A1* | 4/2017 | Flynn | A41D 19/0027 |
| 2017/0358191 | A1* | 12/2017 | Kechichian | G08B 21/02 |

* cited by examiner

ENERGIZED CIRCUIT ALARM ASSEMBLY

CROSS-REFERENCE TO RELATED APPLICATIONS

Statement Regarding Federally Sponsored Research or Development

Not Applicable

THE NAMES OF THE PARTIES TO A JOINT RESEARCH AGREEMENT

Not Applicable

INCORPORATION-BY-REFERENCE OF MATERIAL SUBMITTED ON A COMPACT DISC OR AS A TEXT FILE VIA THE OFFICE ELECTRONIC FILING SYSTEM

Not Applicable

STATEMENT REGARDING PRIOR DISCLOSURES BY THE INVENTOR OR JOINT INVENTOR

Not Applicable

BACKGROUND OF THE INVENTION (1) Field of the Invention (2) Description of Related Art Including Information Disclosed Under 37 CFR 1.97 and 1.98

The disclosure and prior art relates to alarm devices and more particularly pertains to a new alarm device for alerting an electrician that electrical current is present on a circuit.

BRIEF SUMMARY OF THE INVENTION

An embodiment of the disclosure meets the needs presented above by generally comprising a housing that is positoinable on a metal circuit housing in an electrical distribution system. A magnet is coupled to the housing and the magnet magnetically engages a metal circuit housing in an electrical distribution system. A plurality of conductors is each coupled to and extends away from the housing. Each of the conductors is electrically coupled to a respective electrical lead in the metal circuit housing when an electrician is servicing a circuit fed by the electrical lead. An alarm unit is coupled to the housing and each of the conductors is electrically coupled to the alarm unit. The alarm unit emits an alert when the alarm unit senses electrical current on any of the conductors to alert the electrician to the potential for electrocution.

There has thus been outlined, rather broadly, the more important features of the disclosure in order that the detailed description thereof that follows may be better understood, and in order that the present contribution to the art may be better appreciated. There are additional features of the disclosure that will be described hereinafter and which will form the subject matter of the claims appended hereto.

The objects of the disclosure, along with the various features of novelty which characterize the disclosure, are pointed out with particularity in the claims annexed to and forming a part of this disclosure.

BRIEF DESCRIPTION OF SEVERAL VIEWS OF THE DRAWING(S)

The disclosure will be better understood and objects other than those set forth above will become apparent when consideration is given to the following detailed description thereof. Such description makes reference to the annexed drawings wherein.

DETAILED DESCRIPTION OF THE INVENTION

Figure 1:
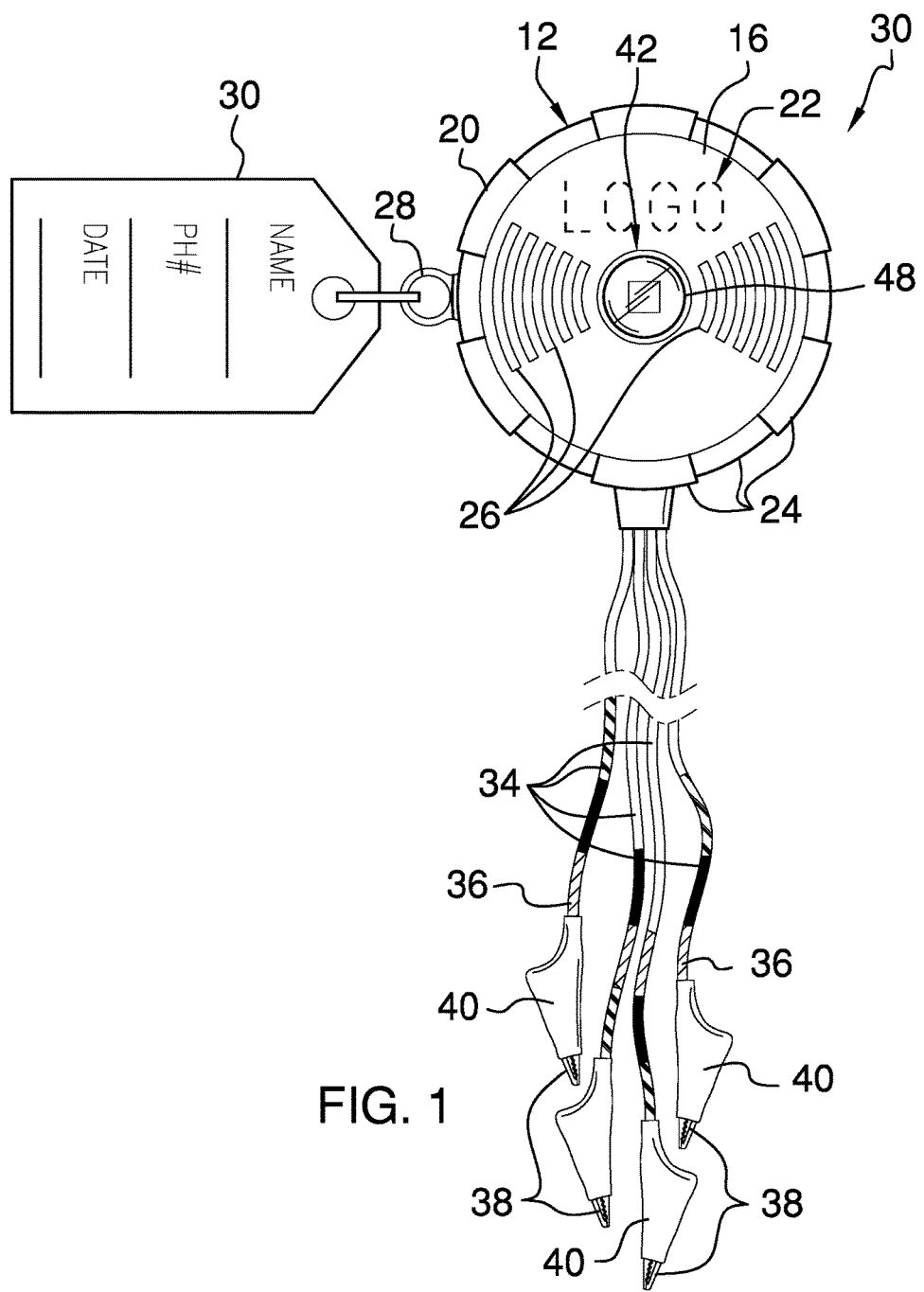
FIG. 1 is a front view of an energized circuit alarm assembly according to an embodiment of the disclosure.
Figure 2:
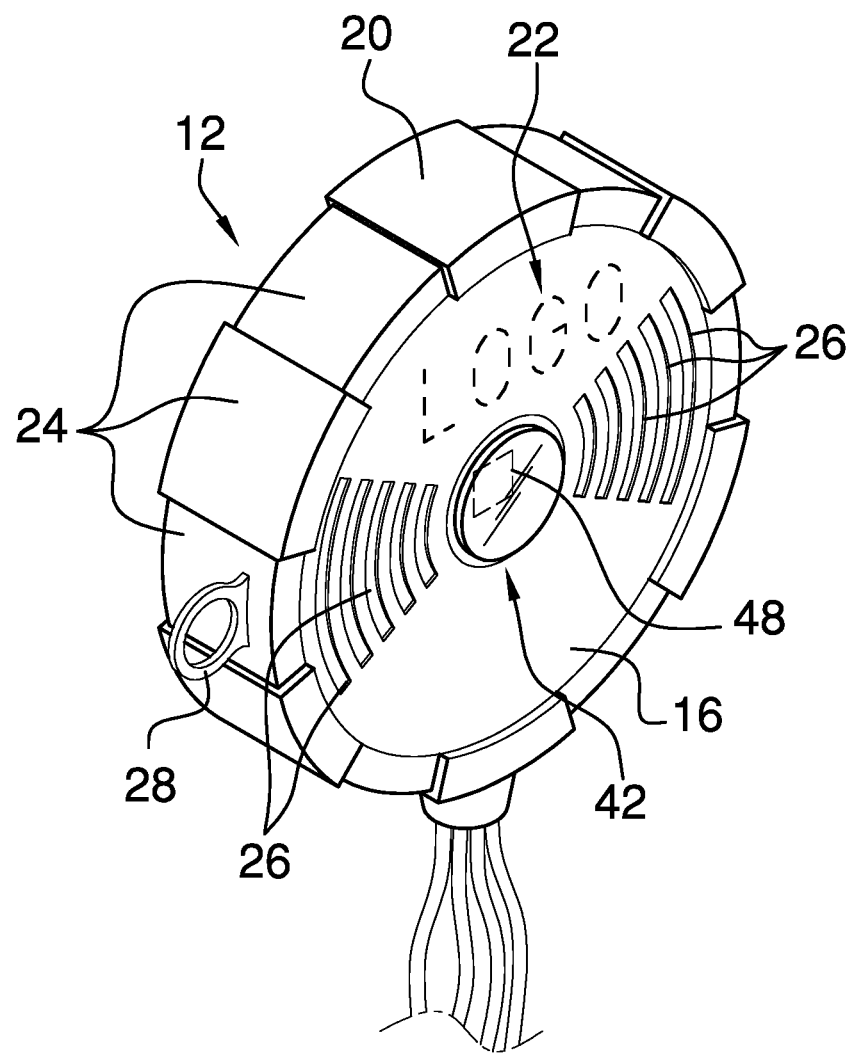
FIG. 2 is a front perspective view of an embodiment of the disclosure.
Figure 3:
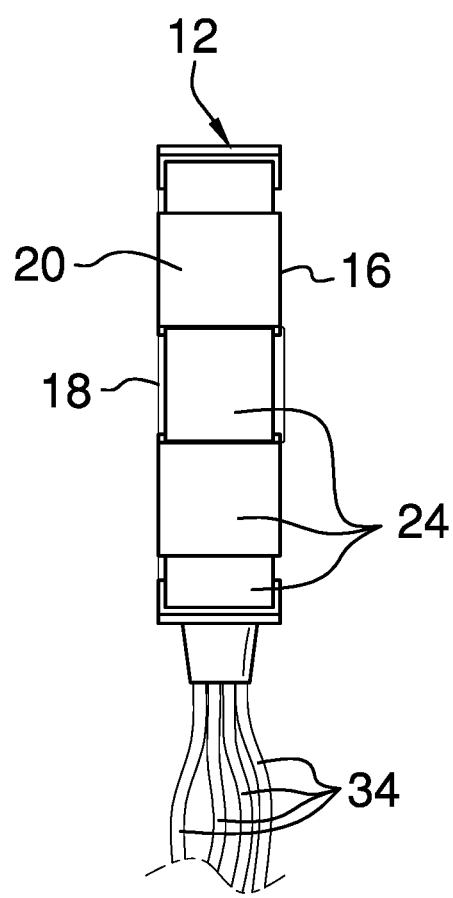
FIG. 3 is a right side view of an embodiment of the disclosure.
Figure 4:
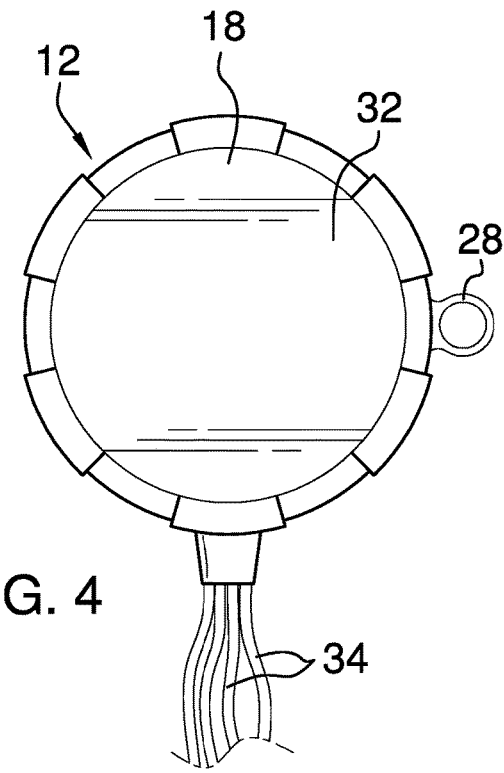
FIG. 4 is a back view of an embodiment of the disclosure.
Figure 5:
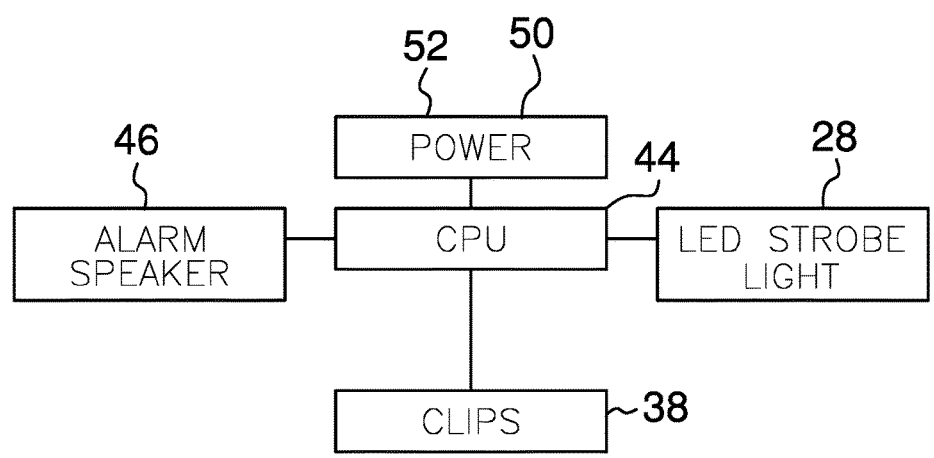
FIG. 5 is a schematic view of an embodiment of the disclosure.
Figure 6:
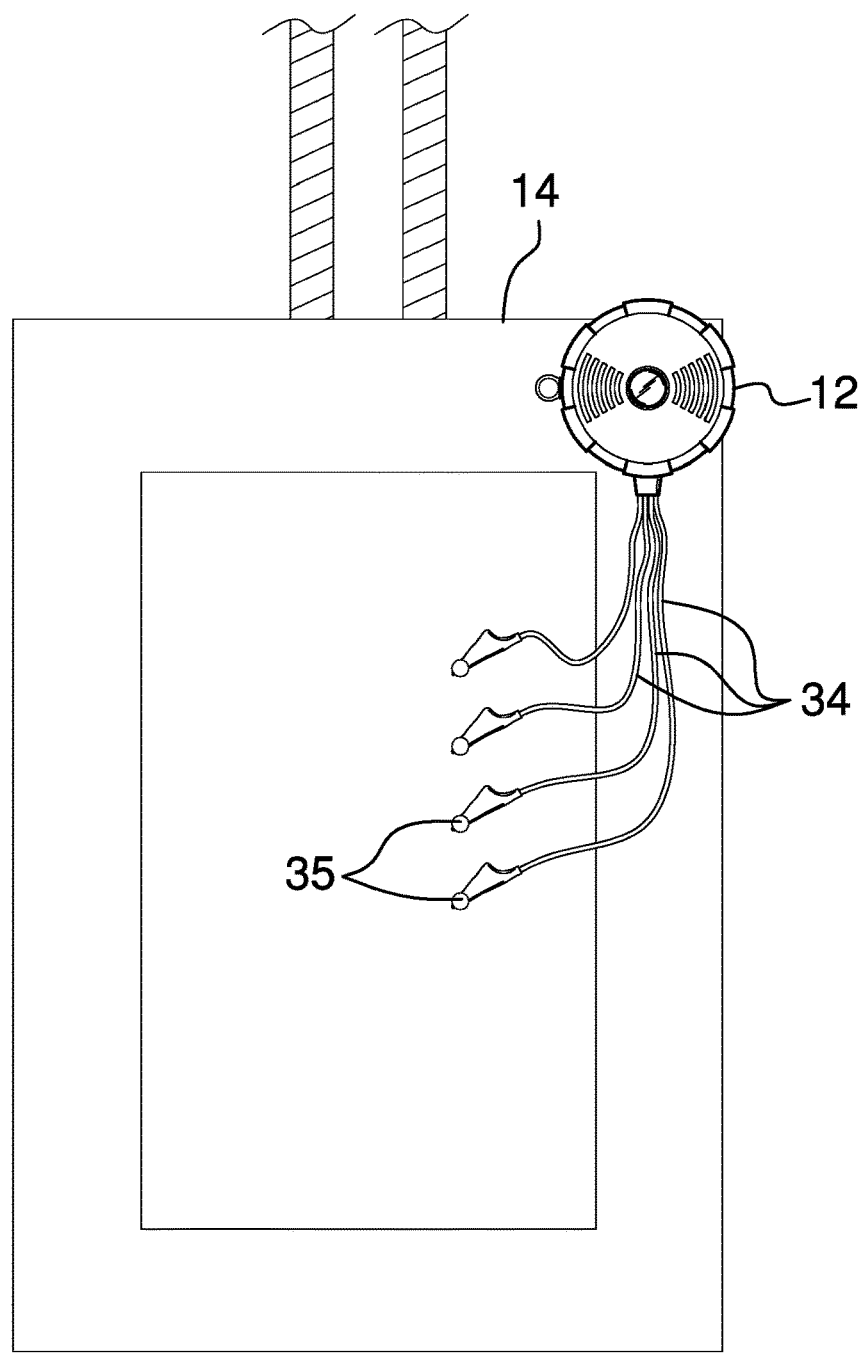
FIG. 6 is a perspective in-use view of an embodiment of the disclosure.

With reference now to the drawings, and in particular to FIGS. 1 through 6 thereof, a new alarm device embodying the principles and concepts of an embodiment of the disclosure and generally designated by the reference numeral 10 will be described.

As best illustrated in FIGS. 1 through 6, the energized circuit alarm assembly 10 generally comprises a housing 12 that is positoinable on a metal circuit housing 14 in an electrical distribution system. The electrical distribution system may be an electrical system in a residence, a commercial building, an industrial building or any other electrical distribution system needing to be serviced by an electrician. The metal circuit housing 14 may be a breaker panel, a switch box or any other similar component commonly found in electrical distribution systems. The housing 12 has a front wall 16, a back wall 18 and an outer wall 20 extending therebetween. The front wall 16 has indicia 22 printed thereon comprising a logo of a company or other selected image.

The outer wall 20 is continuously arcuate such that the housing 12 has a disk shape. Moreover, the outer wall 20 has a plurality of alternating segments 24 that are distributed around an entire perimeter of the outer wall 20. The alternating segments 24 have varying heights with respect to each other thereby enhancing a user's ability to grip the outer wall 20. The front wall 16 of the housing 12 has a plurality of sound openings 26 each extending into an interior of the housing 12. An eyelet 28 is coupled to and extends outwardly from the outer wall 20 of the housing 12 and a lockout tag 30 can attached thereto corresponding to the metal circuit housing 14.

A magnet 32 is coupled to the housing 12 and the magnet 32 magnetically engages the metal circuit housing 14 in the electrical distribution system. Thus, the magnet 32 retains the housing 12 on the metal circuit housing 14. A plurality of conductors 34 is each coupled to and extends away from the housing 12. Each of the conductors 34 is electrically coupled to a respective electrical lead 35 in the metal circuit housing 14 when an electrician is servicing a circuit fed by the electrical lead 35. Moreover, each of the conductors 34 has a respective color coding printed thereon for guiding the electrician to electrically couple the conductors 34 in a preferred arrangement on a three phase A/C circuit or a single phase A/C circuit.

Each of the conductors 34 has a distal end 36 with respect to the housing 12 and a plurality of clips 38 is each electrically coupled to the distal end 36 of a respective one of the conductors 34. Each of the clips 38 is biased into a closed position and each of the clips 38 can be clipped to the respective electrical lead 35. Moreover, each of the clips 38 has an insulator 40 positioned therearound. The insulator 40 on each of the clips 38 is comprised of an electrically insulating material to inhibit electrical communication between the electrician and the respective electrical lead 35 when the electrician positions the clips 38 on the respective electrical lead 35. Each of the clips 38 may be spring loaded alligator clips or the like and each of the conductors 34 may have a length of at least 30.0 inches.

An alarm unit 42 is coupled to the housing 12 and each of the conductors 34 is electrically coupled to the alarm unit 42. The alarm unit 42 emits an alert when the alarm unit 42 senses electrical current on any of the conductors 34. In this way the alarm unit 42 alerts the electrician to the potential for electrocution, thereby enhancing the electrician's safety while the electrician is working.

The alarm unit 42 comprises a control circuit 44 that is positioned within the housing 12 and each of the conductors 34 is electrically coupled to the control circuit 44. The control circuit 44 receives an alert input when the control circuit 44 senses electrical current on any of the conductors 34. The control circuit 44 may include a current sensor, a voltage sensor or any other electronic components involved with sensing electrical current. Additionally, the control circuit 44 may have both A/C and D/C sensing capabilities.

A speaker 46 is coupled to the housing 12 and the speaker 46 emits audible sounds outwardly therefrom when the speaker 46 is turned on. The speaker 46 is turned on when the control circuit 44 receives the alert input. In this way the speaker 46 audibly notifies the electrician to the danger of electrocution. The speaker 46 is aligned with the sound openings 26 in the front wall 16 of the housing 12 and the speaker 46 may be an electronic speaker of any conventional design.

A light emitter 48 is coupled to the front wall 16 of the housing 12 and the light emitter 48 emits light outwardly therefrom when the light emitter 48 is turned on. The light emitter 48 is electrically coupled to the control circuit 44 and the light emitter 48 is turned on when the control circuit 44 receives the alert input. In this way the light emitter 48 visually notifies the electrician to the danger of electrocution. The light emitter 48 may be a strobe light and the light emitter 48 may emit red colored light. A power supply 50 is positioned within the housing 12, the power supply 50 is electrically coupled to the control circuit 44 and the power supply 50 comprises at least one battery 52.

In use, a lockout tag 30 is attached to the eyelet 28 that corresponds to the metal circuit housing 14 in which the electrician will be working. The magnet 32 is positioned against the metal circuit housing 14 to attach the housing 12 to the metal circuit housing 14. Each of conductors 34 is clipped to electrical lead 35s in the metal circuit housing 14 that could potentially supply electrical current to where the electrician will be working. The control circuit 44 receives the alert input when the control circuit 44 senses voltage any of the conductors 34. Thus, the speaker 46 emits the audible alarm and the light emitter 48 emits the visual alert to notify the electrician to the potential of electrocution. In this way the electrician can work on electrical circuits with confidence that the electrical circuits do not have any electrical current.

With respect to the above description then, it is to be realized that the optimum dimensional relationships for the parts of an embodiment enabled by the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by an embodiment of the disclosure.

Therefore, the foregoing is considered as illustrative only of the principles of the disclosure. Further, since numerous modifications and changes will readily occur to those skilled in the art, it is not desired to limit the disclosure to the exact construction and operation shown and described, and accordingly, all suitable modifications and equivalents may be resorted to, falling within the scope of the disclosure. In this patent document, the word "comprising" is used in its non-limiting sense to mean that items following the word are included, but items not specifically mentioned are not excluded. A reference to an element by the indefinite article "a" does not exclude the possibility that more than one of the element is present, unless the context clearly requires that there be only one of the elements.

I claim:

1. An energized circuit alarm assembly being configured to alert an electrician when a circuit being serviced is energized, said assembly comprising:
   a housing being positoinable on a metal circuit housing in an electrical distribution system;
   a magnet being coupled to said housing, said magnet magnetically engaging metal circuit housing in an electrical distribution system wherein said magnet is configured to retain said housing on the metal circuit housing;
   a plurality of conductors, each of said conductors being coupled to and extending away from said housing, each of said conductors being electrically coupled to a respective electrical lead in the metal circuit housing when an electrician is servicing a circuit fed by the electrical lead; and
   an alarm unit being coupled to said housing, each of said conductors being electrically coupled to said alarm unit, said alarm unit emitting an alert when said alarm unit senses electrical current on any of said conductors wherein said alarm unit is configured to alert the electrician to the potential for electrocution.

2. The assembly according to claim 1, wherein:
   said housing has a front wall, a back wall and an outer wall extending therebetween, said outer wall being continuously arcuate such that said housing has a disk shape, said outer wall having a plurality of alternating segments being distributed around an entire perimeter of said outer wall, said alternating segments having varying heights with respect to each other thereby enhancing a user's ability to grip said outer wall;
   said front wall having a plurality of sound openings each extending into an interior of said housing; and
   an eyelet being coupled to and extending outwardly from said outer wall of said housing wherein said eyelet is configured to have a lockout tag attached thereto corresponding to the metal circuit housing.

3. The assembly according to claim 1, wherein each of said conductors has a respective color coding being printed thereon for guiding the electrician to electrically couple said conductors in a preferred arrangement on a three phase A/C circuit or a single phase A/C circuit, each of said conductors having a distal end with respect to said housing.

4. The assembly according to claim 3, further comprising a plurality of clips, each of said clips being electrically coupled to said distal end of a respective one of said conductors, each of said clips being biased into a closed position, each of said clips being clipped to the respective electrical lead, each of said clips having an insulator being positioned therearound, said insulator on each of said clips being comprised of an electrically insulating material wherein said insulator on each of said clips is configured to inhibit electrical communication between the electrician and the respective electrical lead when the electrician positions said clips on the electrical leads.

5. The assembly according to claim 1, wherein said alarm unit comprises a control circuit being positioned within said housing, each of said conductors being electrically coupled to said control circuit, said control circuit receiving an alert input when said control circuit senses electrical current on any of said conductors.

6. The assembly according to claim 5, further comprising a speaker being coupled to said housing wherein said speaker is configured to emit audible sounds outwardly therefrom, said speaker being turned on when said control circuit receives said alert input wherein said speaker is configured to audibly notify the electrician to the danger of electrocution, said speaker being aligned with said sound openings in said front wall of said housing.

7. The assembly according to claim 6, further comprising a light emitter being coupled to said front wall of said housing wherein said light emitter is configured to emit light outwardly therefrom, said light emitter being electrically coupled to said control circuit, said light emitter being turned on when said control circuit receives said alert input wherein said light emitter is configured to visually notify the electrician to the danger of electrocution.

8. The assembly according to claim 5, further comprising a power supply being positioned within said housing, said power supply being electrically coupled to said control circuit, said power supply comprising at least one battery.

9. An energized circuit alarm assembly being configured to alert an electrician when a circuit being serviced is energized, said assembly comprising:
  a housing being positoinable on a metal circuit housing in an electrical distribution system, said housing having a front wall, a back wall and an outer wall extending therebetween, said outer wall being continuously arcuate such that said housing has a disk shape, said outer wall having a plurality of alternating segments being distributed around an entire perimeter of said outer wall, said alternating segments having varying heights with respect to each other thereby enhancing a user's ability to grip said outer wall, said front wall having a plurality of sound openings each extending into an interior of said housing;
  an eyelet being coupled to and extending outwardly from said outer wall of said housing wherein said eyelet is configured to have a lockout tag attached thereto corresponding to the metal circuit housing;
  a magnet being coupled to said housing, said magnet magnetically engaging metal circuit housing in an electrical distribution system wherein said magnet is configured to retain said housing on the metal circuit housing;
  a plurality of conductors, each of said conductors being coupled to and extending away from said housing, each of said conductors being electrically coupled to a respective electrical lead in the metal circuit housing when an electrician is servicing a circuit fed by the electrical lead, each of said conductors having a respective color coding being printed thereon for guiding the electrician to electrically couple said conductors in a preferred arrangement on a three phase A/C circuit or a single phase A/C circuit, each of said conductors having a distal end with respect to said housing;
  a plurality of clips, each of said clips being electrically coupled to said distal end of a respective one of said conductors, each of said clips being biased into a closed position, each of said clips being clipped to the respective electrical lead, each of said clips having an insulator being positioned therearound, said insulator on each of said clips being comprised of an electrically insulating material wherein said insulator on each of said clips is configured to inhibit electrical communication between the electrician and the respective electrical lead when the electrician positions said clips on the electrical leads; and
  an alarm unit being coupled to said housing, each of said conductors being electrically coupled to said alarm unit, said alarm unit emitting an alert when said alarm unit senses electrical current on any of said conductors wherein said alarm unit is configured to alert the electrician to the potential for electrocution, said alarm unit comprising:
    a control circuit being positioned within said housing, each of said conductors being electrically coupled to said control circuit, said control circuit receiving an alert input when said control circuit senses electrical current on any of said conductors;
    a speaker being coupled to said housing wherein said speaker is configured to emit audible sounds outwardly therefrom, said speaker being turned on when said control circuit receives said alert input wherein said speaker is configured to audibly notify the electrician to the danger of electrocution, said speaker being aligned with said sound openings in said front wall of said housing;
    a light emitter being coupled to said front wall of said housing wherein said light emitter is configured to emit light outwardly therefrom, said light emitter being electrically coupled to said control circuit, said light emitter being turned on when said control circuit receives said alert input wherein said light emitter is configured to visually notify the electrician to the danger of electrocution; and
    a power supply being positioned within said housing, said power supply being electrically coupled to said control circuit, said power supply comprising at least one battery.

* * * * *